(12) United States Patent
Yamada et al.

(10) Patent No.: US 7,164,902 B2
(45) Date of Patent: Jan. 16, 2007

(54) FILTER-INTEGRATED EVEN-HARMONIC MIXER AND HI-FREQUENCY RADIO COMMUNICATION DEVICE USING THE SAME

(75) Inventors: Atsushi Yamada, Tenri (JP); Yoshihisa Amano, Nara (JP); Yoshinori Motouchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 440 days.

(21) Appl. No.: 10/493,958

(22) PCT Filed: Oct. 25, 2002

(86) PCT No.: PCT/JP02/11098

§ 371 (c)(1),
(2), (4) Date: Apr. 29, 2004

(87) PCT Pub. No.: WO03/038992

PCT Pub. Date: May 8, 2003

(65) Prior Publication Data

US 2005/0020231 A1 Jan. 27, 2005

(30) Foreign Application Priority Data

Nov. 1, 2001 (JP) .............................. 2001-336573

(51) Int. Cl.
*H04B 1/26* (2006.01)
(52) U.S. Cl. ..................... 455/326; 455/330; 455/293
(58) Field of Classification Search ................ 455/326, 455/313, 316, 317, 318, 320, 323, 324, 330, 455/118, 293, 307, 196.1, 258, 73, 85, 86, 455/327; 333/202, 204; 327/113
See application file for complete search history.

(56) References Cited

U.S. PATENT DOCUMENTS

| | | | | |
|---|---|---|---|---|
| 5,446,923 A | * | 8/1995 | Martinson et al. | 455/330 |
| 6,477,360 B1 | * | 11/2002 | Watanabe et al. | 455/318 |
| 6,879,192 B1 | * | 4/2005 | Merenda | 455/326 |
| 6,901,249 B1 | * | 5/2005 | Kobayashi | 455/327 |
| 7,054,610 B1 | * | 5/2006 | Itoh et al. | 455/324 |

(Continued)

FOREIGN PATENT DOCUMENTS

JP 2-57005 A 2/1990

(Continued)

*Primary Examiner*—Aung Moe
(74) *Attorney, Agent, or Firm*—Birch, Stewart, Kolasch & Birch, LLP

(57) ABSTRACT

Configuration of a connection between an even-harmonic mixer and a filter is simplified, thereby enabling size reduction. An even-harmonic mixer and a high-frequency bandpass filter are connected to each other via a transmission line, thereby forming a filter-integrated even-harmonic mixer. The length of the transmission line is set so that impedance on the transmission line side as viewed from a connection point between the even-harmonic mixer and the transmission line is approximately 0 for a frequency $f_{LO}$ of a local oscillation signal. This allows elimination of an open stub which is used in a conventional even-harmonic mixer and of which the line length to provide equivalent grounding for the frequency $f_{LO}$ is about 1 mm. Thus, the connection portion between the even-harmonic mixer and the high-frequency bandpass filter is simplified and a compact circuit layout for the filter-integrated even-harmonic mixer is obtainable.

18 Claims, 8 Drawing Sheets

U.S. PATENT DOCUMENTS

2003/0102941 A1 6/2003 Amano et al.

FOREIGN PATENT DOCUMENTS

| JP | 2-182005 A | 7/1990 |
| --- | --- | --- |
| JP | 3-154506 A | 7/1991 |
| JP | 4-78203 A | 3/1992 |
| JP | 4-306010 A | 10/1992 |
| JP | 9-69731 A | 3/1997 |
| JP | 9-260955 A | 3/1997 |
| JP | 11-298255 A | 10/1999 |

* cited by examiner though the frequency fif of the intermediate frequency signal is sufficiently lower than the frequency frf, then the connection point 8 connected to the open stub 10 of approximately ¼λ for the local oscillation signal frequency flo functions as an open to the high-frequency signal frf and as a short circuit to the local oscillation signal flo. On the other hand, the connection point 9 connected to the short stub 11 of approximately ¼λ with respect to the local oscillation signal frequency flo functions as a short circuit to the high-frequency signal frf and as an open to the local oscillation signal flo. The local oscillation signal and the high-frequency signal can be isolated from each other. Moreover, the even harmonic signal of the local oscillation signal is canceled in the anti-parallel diode pair 5 and therefore outputted from nowhere.

FILTER-INTEGRATED EVEN-HARMONIC MIXER AND HI-FREQUENCY RADIO COMMUNICATION DEVICE USING THE SAME

This application is the U.S. national phase of International Application PCT/JP02/11098 filed Oct. 25, 2002, which designated the U.S. PCT/JP02/11098 claims priority to JP Patent Application No. 2001-336573 filed Nov. 1, 2001. The entire contents of these applications are incorporated therein by reference.

TECHNICAL FIELD

The present invention relates to a filter-integrated even-harmonic mixer in which an even-harmonic mixer for use in a microwave millimeter wave communication device and a high-frequency bandpass filter are connected to each other via a transmission line, and also to a high-frequency radio communication device employing the mixer.

BACKGROUND ART

FIG. 9 shows a structure of a conventional even-harmonic mixer disclosed in, for example, JP Patent No. 2795972. This even-harmonic mixer is an example of the even-harmonic mixer for a down converter that receives a high-frequency signal (having a frequency frf) and a local oscillation signal (having a frequency flo) and outputs a local frequency of a difference between frf and an even-number multiple of flo as an intermediate frequency signal (frequency fif).

In FIG. 9, reference numeral 1 designates a high-frequency signal terminal, reference numeral 2, a local oscillation signal terminal, reference numeral 3, an intermediate frequency signal terminal and reference numerals 4a and 4b, diodes. These diodes 4a and 4b are connected in parallel, with polarities inverted, thereby constituting an anti-parallel diode pair 5. Further, reference numeral 6 designates a lowpass filter to pass the intermediate frequency signal and reference numeral 7, a bandpass filter that passes the high-frequency signal, the filters both being connected to a first terminal 8 of the anti-parallel diode pair 5. Further connected to this first terminal 8 is an open stub 10 of an approximately quarter wavelength (¼λ) at the local oscillation signal frequency. On the other hand, a short stub 11 of approximately ¼λ at the local oscillation signal frequency is connected to a second terminal 9 of the anti-parallel diode pair 5. It is to be noted that the lowpass filter 6 and the bandpass filter 7 constitute a branching filter 12.

The even-harmonic mixer for a down converter having the aforementioned construction operates as follows. That is, a local oscillation signal of the frequency flo is inputted through the local oscillation signal terminal 2 and applied to the second terminal 9 of the anti-parallel diode pair 5. On the other hand, a high-frequency signal of the frequency frf is inputted through the high-frequency signal terminal 1 and applied to the first terminal 8 of the anti-parallel diode pair 5 via the bandpass filter 7. Then, a mixture wave having a frequency fout given by the next equation is generated across the anti-parallel diode pair 5:

$$fout = |frf \pm 2mflo|$$

where m: an integer, and a signal of the frequency fif given, for example, by the following equation:

$$fif = frf - 2mflo$$

is selected from the mixture waves and outputted as an intermediate frequency signal from the intermediate frequency signal terminal 3.

In this case, if the frequency fif of the intermediate frequency signal is sufficiently lower than the frequency frf, then the connection point 8 connected to the open stub 10 of approximately ¼λ for the local oscillation signal frequency flo functions as an open to the high-frequency signal frf and as a short circuit to the local oscillation signal flo. On the other hand, the connection point 9 connected to the short stub 11 of approximately ¼λ with respect to the local oscillation signal frequency flo functions as a short circuit to the high-frequency signal frf and as an open to the local oscillation signal flo. The local oscillation signal and the high-frequency signal can be isolated from each other. Moreover, the even harmonic signal of the local oscillation signal is canceled in the anti-parallel diode pair 5 and therefore outputted from nowhere.

It is also possible to make the even-harmonic mixer for a down converter having the aforementioned construction function as a mixer for an upconverter that receives an intermediate frequency signal at the intermediate frequency signal terminal 3 and a local oscillation signal at the local oscillation signal terminal 2 and outputs a high-frequency signal from the high-frequency signal terminal 1.

However, the aforementioned conventional even-harmonic mixer has the following problems. That is, it is required to additionally connect a bandpass filter for allowing the high-frequency signal inputted to the high-frequency signal terminal 1 to pass, and this increases the costs of the components and of the mounting process. Moreover, when the milliwave band frequency is very high, a loss at a connection between the even-harmonic mixer and the bandpass filter becomes significant, and the characteristic is deteriorated.

On the other hand, for the purpose of reducing the costs for the components and the mounting process and reducing the loss at the connection point between the even-harmonic mixer and the bandpass filter, it is conceivable to form the even-harmonic mixer and the bandpass filter on one semiconductor substrate to thereby integrate them into one semiconductor chip. However, in such a case, if the higher harmonic mixer and the bandpass filter are separately designed and integrated by simply being arranged on a semiconductor chip and connected together by means of a transmission line of an appropriate length, the passive circuit of the open stub 10 and the short stub 11 of the even-harmonic mixer, the filters 6 and 7 and so on disadvantageously will occupy the greater part of the area. Accordingly, there is a problem that the area of the semiconductor chip is increased and the unit price of the semiconductor chip is raised.

DISCLOSURE OF THE INVENTION

Accordingly, the present invention provides a filter-integrated even-harmonic mixer capable of simplifying the construction of a connection portion between an even-harmonic mixer and a filter, reducing the circuit size, and reducing the cost of an associated semiconductor chip, and to provide a high-frequency radio communication device that employs the filter-integrated even-harmonic mixer.

In order to accomplish the above, according to a first aspect of the present invention, there is provided a filter-integrated even-harmonic mixer in which an even-harmonic mixer and a high-frequency bandpass filter are connected to each other via a transmission line, wherein the transmission line has a length set so that impedance of the filter-integrated even-harmonic mixer on the transmission line side viewed from a connection point between the even-harmonic mixer and the transmission line is roughly zero for a frequency of a local oscillation signal inputted to the even-harmonic mixer.

According to the above-mentioned construction, the impedance on the transmission line side viewed from the connection point between the even-harmonic mixer and the transmission line is roughly zero, making short circuit, with respect to the frequency of the local oscillation signal. Therefore, it becomes possible to eliminate the open stub for providing equivalent grounding for the frequency of the local oscillation signal. As a result, in comparison with the conventional case where a separate high-frequency bandpass filter is connected to the even-harmonic mixer, an area to be occupied by the filter-integrated even-harmonic mixer of the present invention is reduced and the area and the cost of the filter-integrated even-harmonic mixer when its components are formed into a chip are reduced.

In one embodiment, a circuit in which the transmission line and the high-frequency bandpass filter are integrated with each other has a transmission loss of 20 dB or more, a reflection loss of approximately 0 dB and a reflection phase angle of approximately −180° at the frequency of the local oscillation signal.

In this embodiment, the circuit having the integrated transmission line and high-frequency bandpass filter has a reflection coefficient of −1 with respect to the frequency of the local oscillation signal, from which the circuit can be considered to be equivalent to grounding.

In one embodiment, the even-harmonic mixer includes at least an anti-parallel diode pair and a short stub.

According to this embodiment, no open stub is included in the even-harmonic mixer. Therefore, the occupation area of the even-harmonic mixer and hence of the present filter-integrated even-harmonic mixer is consequently reduced, and the circuit scale is reduced.

In one embodiment, the filter-integrated even-harmonic mixer is formed on a semiconductor substrate.

According to this embodiment, the even-harmonic mixer, the high-frequency bandpass filter and the transmission line are integrated on one semiconductor substrate. Therefore, when the frequency in the milliwave band or the like is very high, signal loss at the connection portion between the high-frequency bandpass filter and the even-harmonic mixer is suppressed to the utmost. Furthermore, size reduction of the whole circuit combined with the circuit construction including no open stub as described above will lead to a reduced cost per semiconductor chip.

In one embodiment, the high-frequency bandpass filter has a microstrip resonator.

According to this embodiment, the impedance of the microstrip resonator is significantly increased for the signal that has a frequency within the passband of the filter. Therefore, the signal can pass through a capacitor inside the high-frequency bandpass filter. In contrast to this, the impedance of the microstrip resonator is reduced for a signal that has a frequency far apart from the passband of the filter, and the signal does not pass through the capacitor, but is reflected.

In one embodiment, the high-frequency bandpass filter has an input circuit and an output circuit, which are each constructed of a microstrip line, and the input circuit and the output circuit are coupled to each other by at least one of capacitive coupling and magnetic coupling.

According to this embodiment, it becomes possible to obtain a steep filter characteristic by forming a large attenuation pole in the close vicinity of the passband of the filter.

Also, according to a second aspect of the present invention, there is provided a high-frequency radio communication device that employs the filter-integrated even-harmonic mixer according to the first aspect of the present invention.

According to the above-mentioned construction, because the even-harmonic mixer integrated with the high-frequency bandpass filter is used, the gain of an amplifier for outputting a desired transmission power is reduced. Therefore, reduction in cost and power consumption can be achieved.

In one embodiment, the anti-parallel diode pair has one end constituting the connection point and the other end connected to the short stub.

Also, in one embodiment, a local oscillation signal is inputted to a connection point between the anti-parallel diode pair and the short stub.

According to this embodiment, even without the open stub for providing equivalent grounding for the frequency of the local oscillation signal, which has been employed in the conventional case, the voltage of the local oscillation signal is wholly applied to the anti-parallel diode pair. Therefore, the local oscillation signal and an input signal (e.g., an intermediate frequency signal) are mixed with each other in the anti-parallel diode pair, and a signal having various signal components is generated.

In one embodiment, the filter-integrated even-harmonic mixer is integrated in one semiconductor chip.

According to this embodiment, the circuit scale per semiconductor chip that constitutes the filter-integrated even-harmonic mixer is reduced, and the cost is reduced.

BEST MODE FOR CARRYING OUT THE INVENTION

Figure 1:
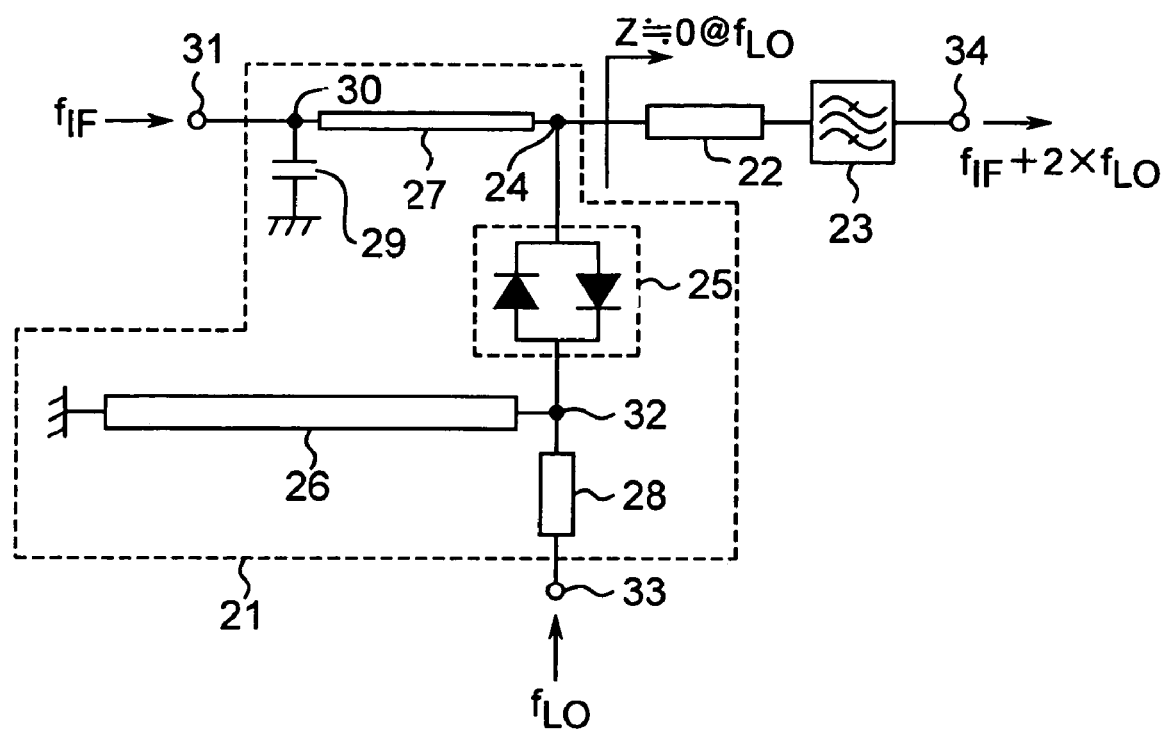
FIG. 1 is a diagram showing the construction of a filter-integrated even-harmonic mixer of this invention.

This invention will be described in detail below on the basis of the embodiments shown in the drawings.

(First Embodiment)

FIG. 1 is a diagram showing the construction of the filter-integrated even-harmonic mixer of the present embodiment. In this case, reference is made on the basis of an example of an even-harmonic mixer for an upconverter that receives an intermediate frequency signal (having a frequency $f_{IF}$) and a local oscillation signal (having a frequency $f_{LO}$) as inputs thereto and outputs a high-frequency signal (frequency $f_{RF}$) of a frequency obtained by mixing double the frequency $f_{LO}$ with the frequency $f_{IF}$. That is, the frequency $f_{RF}$, the frequency $f_{IF}$ and the frequency $f_{LO}$ have the following relationship:

$$f_{RF}=2\times f_{LO}+f_{IF}.$$

The present filter-integrated even-harmonic mixer is constructed of an even-harmonic mixer 21, a transmission line 22 and a high-frequency bandpass filter 23. The even-harmonic mixer 21 and one end of the high-frequency bandpass filter 23 are connected to each other via a transmission line 22. Moreover, the length of the transmission line 22 is set so that impedance on the transmission line 22 side viewed from a connection point 24 between the even-harmonic mixer 21 and the transmission line 22 becomes approximately zero at the frequency $f_{LO}$ of the local oscillation signal.

The even-harmonic mixer 21 is constructed of an anti-parallel diode pair 25 constituted by parallel-connecting two diodes with their polarities inverted to each other, a short stub 26, an intermediate frequency signal transmission line 27, a local oscillation signal transmission line 28, and a capacitor 29.

One end of the intermediate frequency signal transmission line 27 is connected to the connection point 24 located between the anti-parallel diode pair 25 and the transmission line 22. One end of the capacitor 29 is connected to the other end 30 of the intermediate frequency signal transmission line 27, while the other end of the capacitor 29 is grounded. The connection point 30 located between the intermediate frequency signal transmission line 27 and the capacitor 29 serves as an intermediate frequency signal terminal 31. Further, a short stub 26 is connected to the other end of the anti-parallel diode pair 25. One end of the local oscillation signal transmission line 28 is connected to a connection point 32 between the anti-parallel diode pair 25 and the short stub 26, while the other end of the local oscillation signal transmission line 28 serves as a local oscillation signal terminal 33. The length of this short stub 26 is set so that the stub has ¼λ for the frequency $f_{LO}$.

The filter-integrated even-harmonic mixer of the aforementioned construction operates as follows. That is, the local oscillation signal of the frequency $f_{LO}$ inputted from the local oscillation signal terminal 33 is transmitted through the local oscillation signal transmission line 28 to the anti-parallel diode pair 25. On the other hand, since the length of the short stub 26 is set so that the stub has ¼λ at the frequency $f_{LO}$, the stub becomes equivalent to being open with respect to the frequency $f_{LO}$, and this is equal to that nothing is connected.

Moreover, since the impedance on the transmission line 22 side viewed from the connection point 24 located between the even-harmonic mixer 21 and the transmission line 22 is approximately zero at the frequency $f_{LO}$, the connection point 24 is roughly equal to a grounded condition for the frequency $f_{LO}$. Therefore, the voltage of the aforementioned inputted local oscillation signal is wholly applied to the anti-parallel diode pair 25. Then, the local oscillation signal inputted from the local oscillation signal terminal 33 and the intermediate frequency signal of the frequency $f_{IF}$ inputted from an intermediate frequency signal terminal 31 are mixed with each other in the anti-parallel diode pair 25, and signals having various frequency components are generated. Then, among these signals, only a signal having a frequency component of $f_{RF}=2\times f_{LO}+f_{IF}$ is transmitted through the bandpass filter 23, while the other signals having the other frequency components, which cannot pass through the bandpass filter 23, are reflected. As a result, only the signal of the frequency of $f_{RF}=2\times f_{LO}+f_{IF}$ is outputted from a high-frequency signal terminal 34. Moreover, the intermediate frequency signal transmission line 27, which is set to ¼λ at the frequency $f_{RF}$, becomes equivalent to an open for the frequency $f_{RF}$ so that practically nothing is connected. Consequently, the signal of the frequency $f_{RF}$ is not outputted from the intermediate frequency signal terminal 31.

Further, if the frequency $f_{IF}$ is smaller than the frequency $f_{RF}$, then the frequency $f_{RF}$ becomes:

$$f_{RF} \approx 2\times f_{LO},$$

and therefore, the short stub 26 comes to have approximately ½λ (half wavelength) at the frequency $f_{RF}$, so that the connection point 32 becomes roughly equivalent to grounding for the frequency $f_{RF}$. Therefore, the signal of the frequency $f_{RF}$ is also not outputted from the local oscillation signal terminal 33.

Figure 2A:
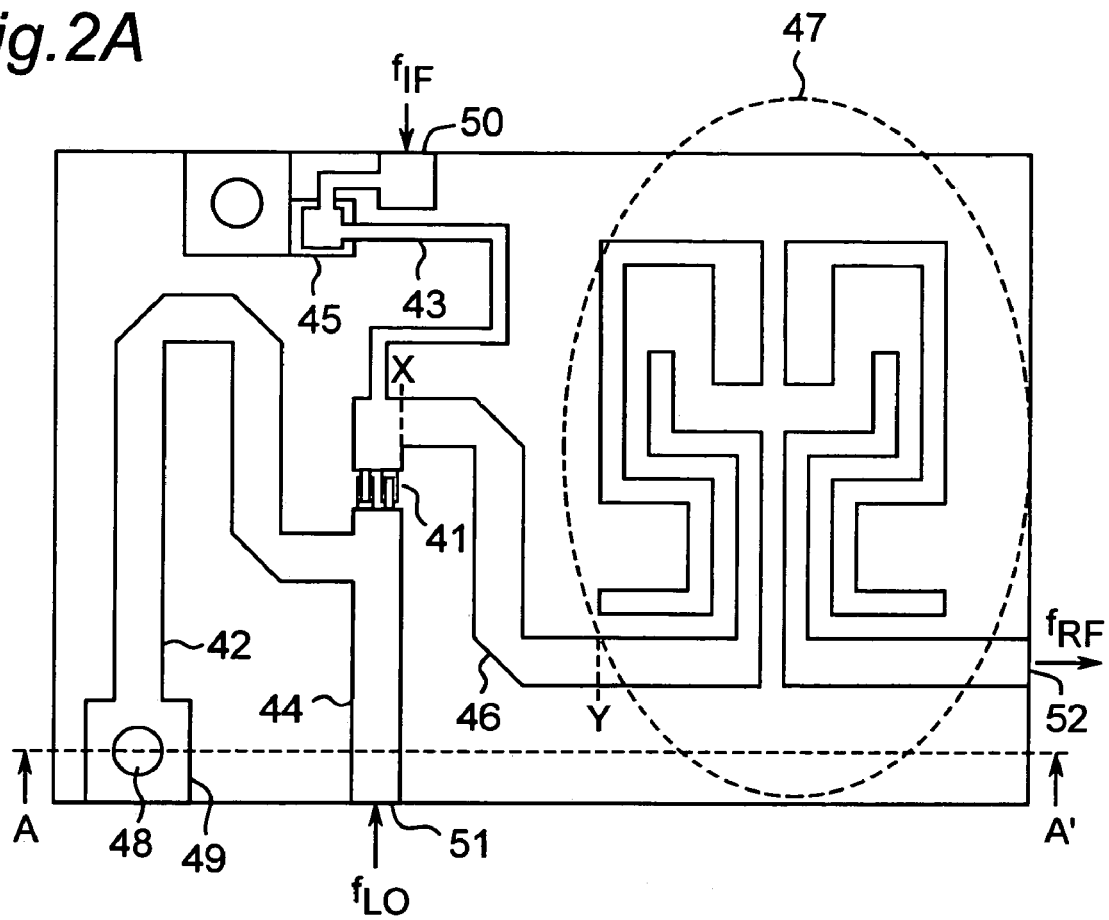
FIGS. 2A and 2B are views showing a concrete construction in which the filter-integrated even-harmonic mixer shown in FIG. 1 is formed on a gallium arsenide substrate.
Figure 2B:
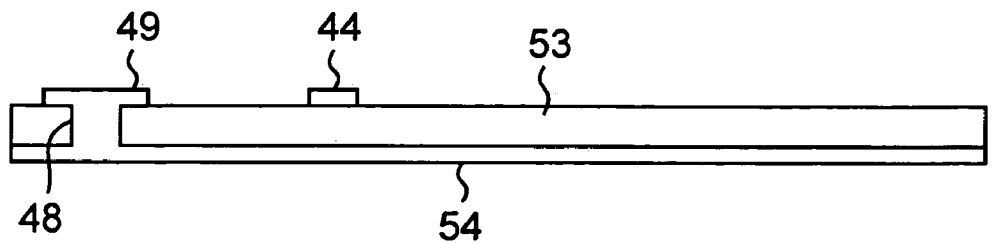

FIGS. 2A and 2B show a concrete example in which the filter-integrated even-harmonic mixer having the construction shown in FIG. 1 is formed on a gallium arsenide substrate having a thickness of 70 μm. FIG. 2A is a plan view, and FIG. 2B is a sectional view taken along the arrow line A–A' in FIG. 2A. In this case, it is assumed that the frequency $f_{LO}$ is 29.5 GHz, the frequency $f_{IF}$ is 1 GHz to 3 GHz, and that the frequency $f_{RF}$ is 60 GHz to 62 GHz. The substrate has a size of approximately 0.7 mm×1.0 mm.

In FIGS. 2A and 2B, there are shown an anti-parallel diode pair 41, a short stub 42, an intermediate frequency signal transmission line 43, a local oscillation signal transmission line 44 and a MIM (metal-insulator-metal) capacitor 45, which parts constitute an even-harmonic mixer. Further, a filter-integrated even-harmonic mixer is constructed of this even-harmonic mixer, a transmission line 46 and a high-frequency bandpass filter 47. In this case, each of the short stub 42, the transmission line 46 and the local oscillation signal transmission line 44 has a line width of 55 microns so that the characteristic impedance becomes approximately 50 Ω. Moreover, the intermediate frequency signal transmission line 43 is formed to have a line width of 25 microns so that the characteristic impedance becomes approximately 70 Ω. These lines are formed properly bent to reduce the total size.

There are further shown an intermediate frequency signal terminal 50, a local oscillation signal terminal 51, a high-frequency signal terminal 52, a gallium arsenide substrate 53 and a grounding metal 54.

The short stub 42 has its length set so that ¼λ is reached at the frequency $f_{LO}$ (29.5 GHz) including the length of a through hole 48 and a pad 49. The MIM capacitor 45 is set to 0.4 pF so that the capacitor has a high impedance with respect to the intermediate frequency signal and low impedance with respect to the high-frequency signal.

The transmission line 46 (between X and Y) has an effective length of 450 μm. The effective length is defined as a length along the bent line. That is, the transmission line having the effective length of 450 μm is a transmission line that has an electrical length equivalent to that of a straight line (a line being not bent) having a length of 450 μm.

Figure 3A:
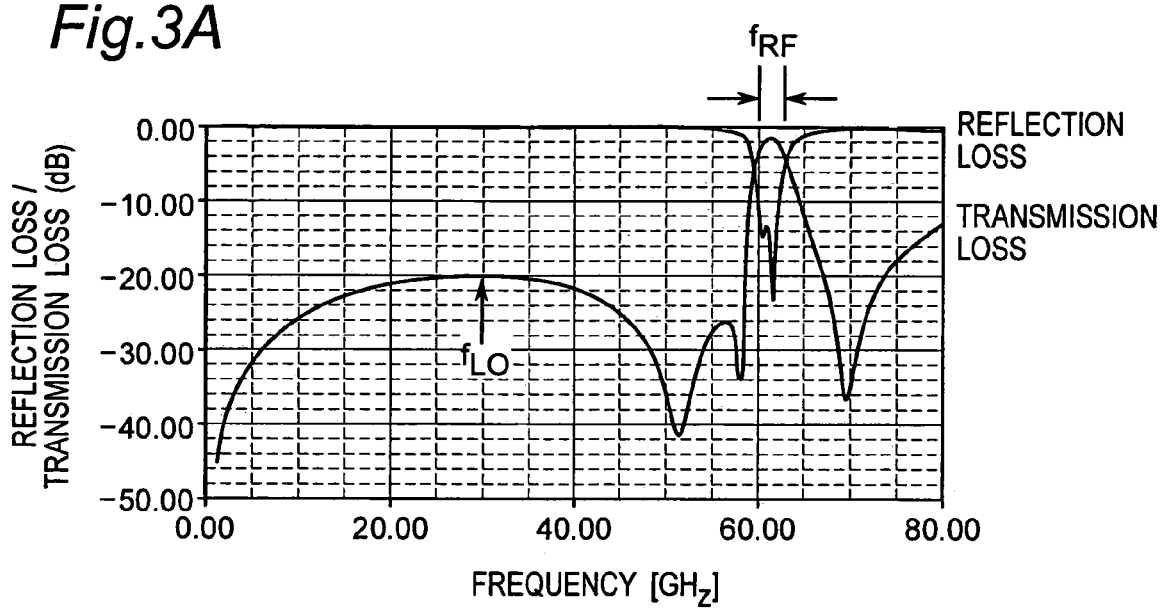
FIGS. 3A and 3B are graphs showing a reflection loss/transmission loss and a reflection phase angle when the transmission line and high-frequency bandpass filter sides are viewed from the connection point X of FIG. 2A.
Figure 3B:
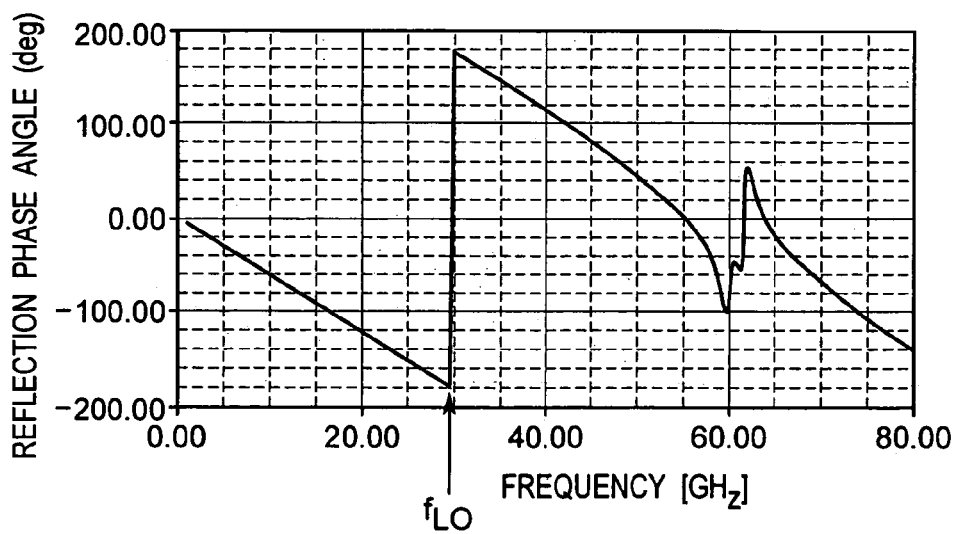

A reflection loss and a transmission loss on the right-hand side (on the transmission line 46 and high-frequency bandpass filter 47 sides) viewed from the connection point X in the figure become as shown in FIG. 3A, and a reflection phase angle becomes as shown in FIG. 3B. That is, the transmission loss is about 2 dB at the frequency $f_{RF}$ (60 GHz to 62 GHz), and most of the signal at the frequency $f_{RF}$ is transmitted. In contrast to this, at the frequency $f_{LO}$ (29.5 GHz), there is exhibited a characteristic that the transmission loss is about 20 dB, the reflection loss is about 0 dB and the reflection phase angle is −180°. This means that the reflection coefficient at the frequency $f_{LO}$ is approximately −1, which can be regarded as equivalent to grounding.

As the result of the above, even if the open stub for providing equivalent grounding for the frequency $f_{LO}$ as in the conventional case does not exist, the voltage of the local oscillation signal is wholly applied to the anti-parallel diode pair 41. As described above, the aforementioned open stub having a length approximately equal to that of the short stub 42 (whose line length is about 1 mm) in FIGS. 2A and 2B can be eliminated. Thus, as is apparent from FIGS. 2A and 2B, it is possible to provide a very compact circuit layout of a filter-integrated even-harmonic mixer and hence shrink the chip size.

The original purpose of the high-frequency bandpass filter 23, 47 is to transmit the signal of the frequency $f_{RF}$ (60 GHz to 62 GHz) and largely attenuate unnecessary signals that have frequency components in the vicinity of this frequency and, in particular, signals that have a frequency component of a frequency of $2 \times f_{LO}$ (59 GHz) and a frequency component of a frequency of $2 \times f_{LO}$ (59 GHz) minus $f_{IF}$ (1 GHz to 3 GHz) (=56 GHz to 58 GHz). However, the present inventors have come to make the present invention, thinking of using the high-frequency bandpass filter 23, 47 as a part of a circuit needed for an even-harmonic mixer by taking advantage of the characteristics of the high-frequency bandpass filter 23, 47 that the transmission loss is about 20 dB, the reflection loss is 0 dB and the reflection phase angle is −180° at the frequency $f_{LO}$ (29.5 GHz).

The high-frequency bandpass filter 47 will be described in detail below with reference to FIG. 4. The high-frequency bandpass filter 47 is constructed roughly of transmission lines 121 through 124. The transmission lines 121 and 122 constitute an input circuit or an output circuit, and their ends 125 and 126 function as an input terminal or an output terminal. Each of the transmission lines 123 and 124 has a length of about ½λ with respect to a center frequency of the transmission signal having the wavelength λ and constitutes an open line resonator as a microstrip resonator.

Part of the transmission line 121 and part of the transmission line 123 are arranged parallel and capacitively coupled to each other. Likewise, part of the transmission line 122 and part of the transmission line 124 are arranged parallel and capacitively coupled to each other. Moreover, part of the transmission line 123 and part of the transmission line 124 are arranged parallel (the portion of an oval 128) and capacitively coupled to each other. Further, part of the transmission line 121 and part of the transmission line 122 are arranged parallel (the portion of an oval 127) and capacitively and magnetically coupled to each other.

Figure 4:
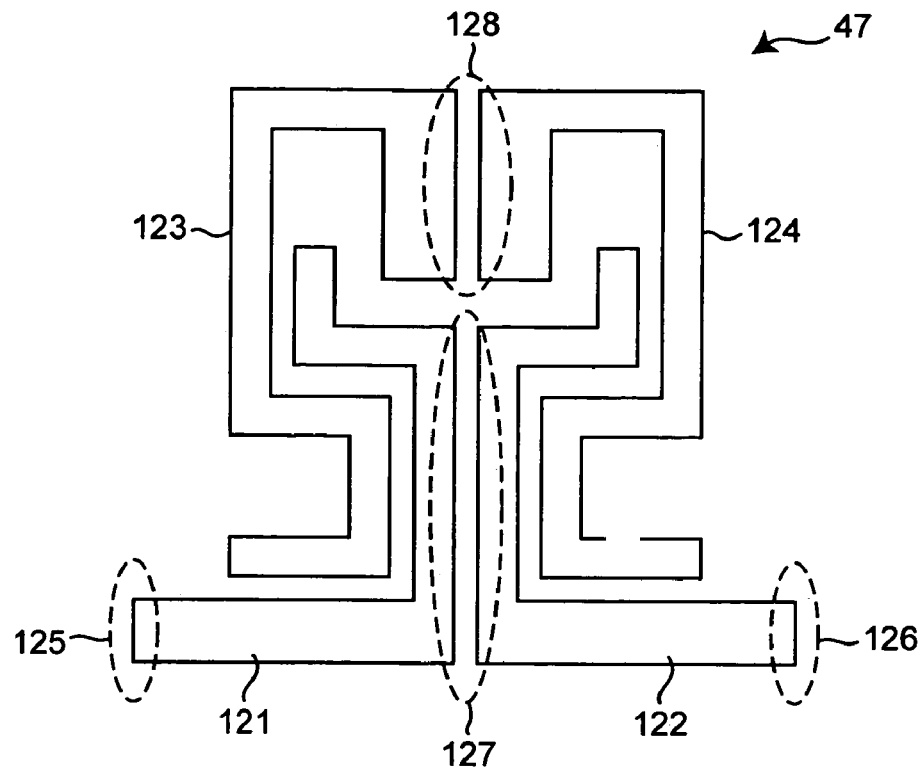
FIG. 4 is an enlarged view of the high-frequency bandpass filter of FIGS. 2A and 2B.
Figure 5:
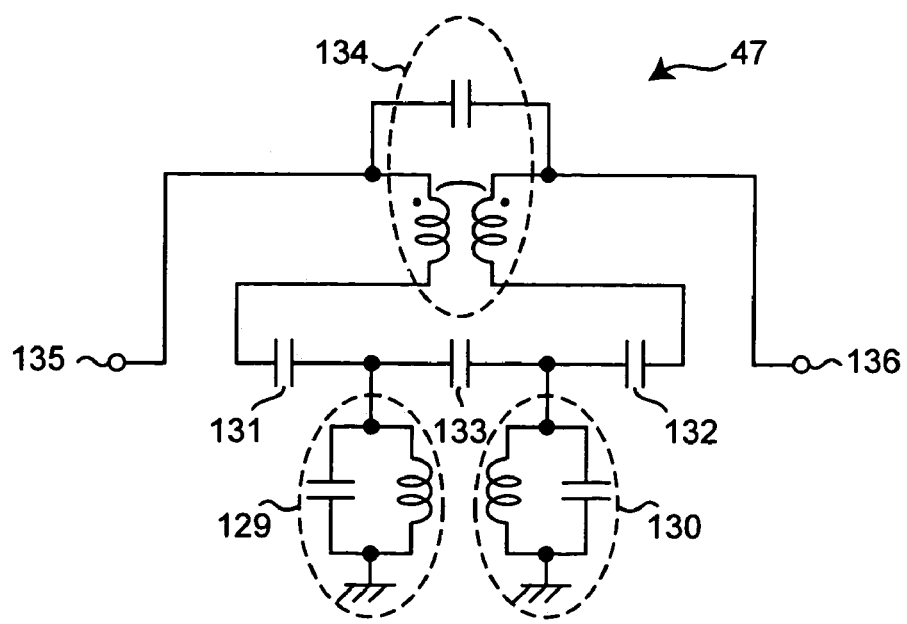
FIG. 5 is a circuit diagram in which the high-frequency bandpass filter shown in FIG. 4 is represented by a roughly equivalent lumped constant.

In order to make the above arrangement easier to understand, FIG. 5 shows a circuit diagram in which the high-frequency bandpass filter 47 shown in FIG. 4 is represented by a roughly equivalent lumped constant. A resonator 129 and a resonator 130 correspond to the transmission line 123 and the transmission line 124 in FIG. 4. A capacitor 131 represents capacitive coupling between the transmission line 121 and the transmission line 123 in FIG. 4. A capacitor 132 represents capacitive coupling between the transmission line 122 and the transmission line 124. Further, a capacitor 133 represents capacitive coupling 128 between the transmission line 123 and the transmission line 124 in FIG. 4. Moreover, coupling indicated by an oval 134 represents capacitive coupling and magnetic coupling indicated by the oval 127 in FIG. 4.

The operation of the high-frequency bandpass filter 47 will be described next with reference to FIG. 5. With respect to a signal that has a frequency inside the passband of the filter, the impedances of the resonators 129 and 130 become very high. Therefore, the signal inputted from an input terminal 135 or an input terminal 136 can be transmitted through the capacitors 131, 132 and 133. In contrast to this, with respect to a signal that has a frequency far apart from the passband of the filter, the impedances of the resonators 129 and 130 become low. Therefore, the signal is reflected as a consequence of failing in passing through the capacitor 133. On the other hand, in the case of a signal that has a frequency slightly apart from the passband of the filter, the phase of the signal that passes through the capacitors 131, 132 and 133 and the phase of the signal that passes through the coupling 134 are mutually inverted and canceled. That is, a great attenuation pole is formed in the close vicinity of the passband of the filter, so that a steep filter characteristic can be obtained.

Therefore, by employing the high-frequency bandpass filter 47, a more compact filter-integrated even-harmonic mixer having excellent characteristic can be provided.

In the high-frequency bandpass filter 47, the steep attenuation characteristic is achieved in the close vicinity of the passband by constituting the coupling 127 in FIG. 4 of capacitive coupling and magnetic coupling like the coupling 134 shown in FIG. 5. However, even if the coupling is constituted of either one of capacitive coupling and magnetic coupling, the effects of the present embodiment can be sufficiently obtained although the attenuation characteristic is inferior to the case where the coupling is constituted of both the above-mentioned couplings.

The high-frequency bandpass filter 23, 47 is not limited to the one shown in FIGS. 2A and 2B but allowed to have another configuration or structure so long as the filter has characteristics that satisfy the original purposes of transmitting the signal of the frequency $f_{RF}$ and largely attenuating the unnecessary signals in the neighborhood frequency band and has the characteristics of a large transmission loss and a small reflection loss for the signal of the frequency $f_{LO}$. The larger the transmission loss for the frequency $f_{LO}$, the greater the effects of the present invention are produced. A required criterion is about 20 dB or more. It is to be noted that the optimum length of the transmission line of the present invention depends on the filter structure. Therefore, when a high-frequency bandpass filter of another structure is employed, the length of the transmission line is required to be set so that impedance on the right-hand side in the figure viewed from the connection point X becomes zero at the frequency $f_{LO}$.

Although a microstrip line is employed in the example of FIGS. 2A and 2B, it is also acceptable to employ a coplanar line or a ground coplanar line. Moreover, although the functions of the up-converter for converting an intermediate frequency signal into a high-frequency signal have been described, the mixer can also be employed as a down converter for converting a high-frequency signal into an intermediate frequency signal.

Figure 6:
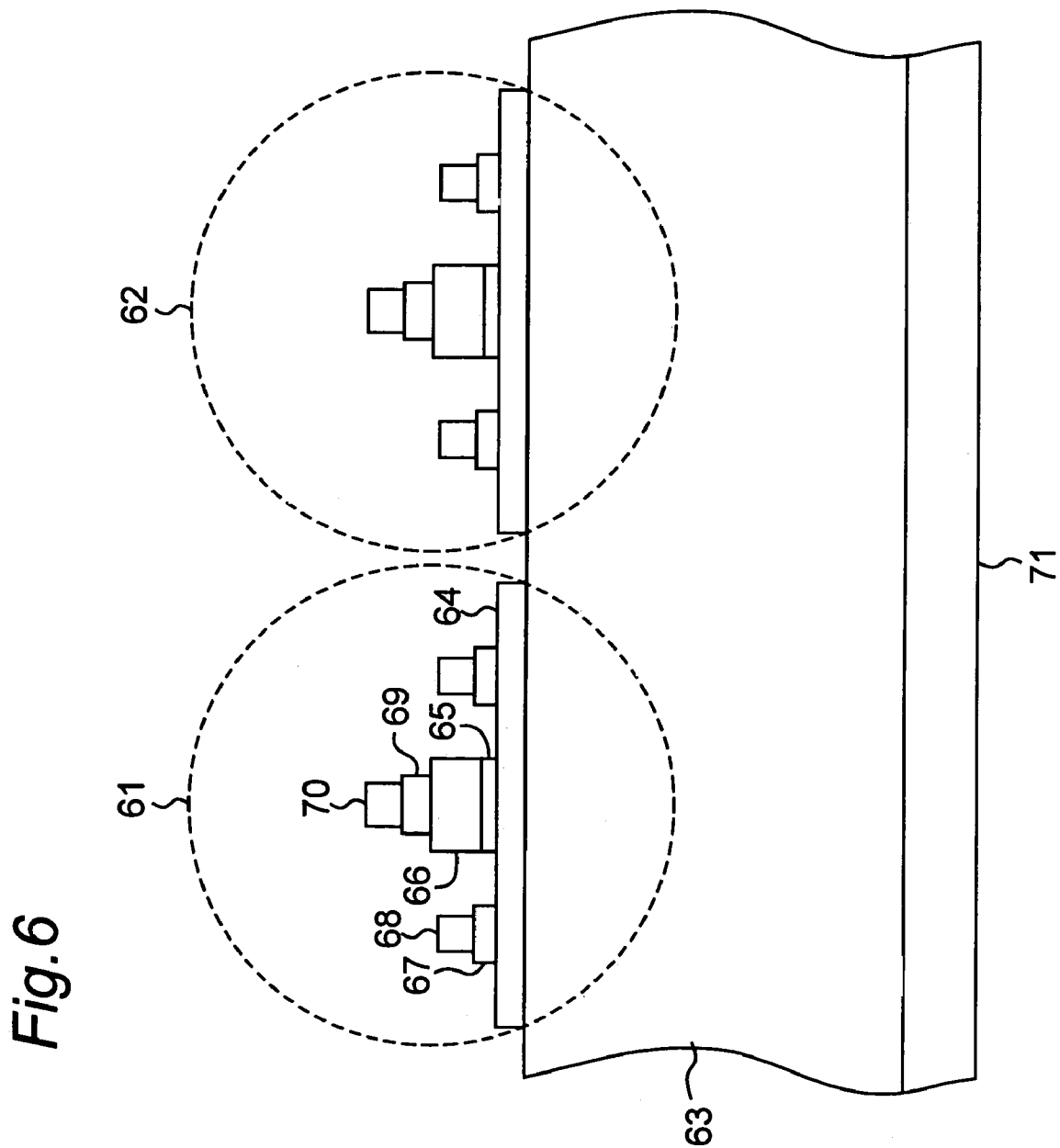
FIG. 6 is a longitudinal sectional view of an anti-parallel diode pair in FIG. 2.

FIG. 6 shows a longitudinal sectional view of the anti-parallel diode pair 41. The anti-parallel diode pair 41 is constituted by connecting parallel two diodes 61 and 62 of mutually inverted polarities. Both the diodes (represented by the diode 61 in FIG. 6) have the constructions as follows. That is, an n$^+$GaAs layer 64 having a carrier density of $5.0\times10^{18}$ cm$^{-3}$ and a thickness of 500 nm, an n$^+$GaInP layer 65 having a carrier density of $3.0\times10^{18}$ cm$^{-3}$ and a thickness of 20 nm and an n$^-$GaAs layer 66 having a carrier density of $3.0\times10^{16}$ cm$^{-3}$ and a thickness of 700 nm are successively epitaxially grown on a semi-insulating gallium arsenide substrate 63. Further, an ohmic electrode 67 made of AuGe/Ni/Au and a metal interconnection 68 are formed on the n$^+$GaAs layer 64. Moreover, a Schottky electrode 69 made of Ti/Pt/Au and a metal interconnection 70 are formed on the n$^-$GaAs layer 66. The Schottky electrode of the diode of the present invention described above has an area of 6 μm×7 μm. Reference numeral 71 denotes grounding metal.

As described above, in the present embodiment, the filter-integrated even-harmonic mixer is constituted by connecting one end of the even-harmonic mixer 21 to one end of the high-frequency bandpass filter 23, 47 via the transmission line 22, 46. Moreover, the even-harmonic mixer 21 is constructed of the anti-parallel diode pair 25, 41 constituted by connecting parallel two diodes with their polarities mutually inverted, the intermediate frequency signal transmission line 27, 43 connected to one end of this anti-parallel diode pair 25, 41, the short stub 26, 42 connected to the other end of the anti-parallel diode pair 25, 41, and the local oscillation signal transmission line 28, 44 connected to the connection point 32 between the anti-parallel diode pair 25, 41 and the short stub 26, 42.

In the above case, the high-frequency bandpass filter 23, 47 has characteristics of a transmission loss of about 20 dB, a reflection loss of 0 dB and a reflection phase angle of −180° at the frequency $f_{LO}$ in addition to the characteristics of transmitting the signal of the frequency $f_{RF}$ and largely attenuating the unnecessary signals of the neighborhood frequency components by properly setting the effective length of the transmission line 22, 46. Therefore, impedance on the transmission line 22, 46 side viewed from the connection point 24, X between the even-harmonic mixer 21 and the transmission line 22, 46 is approximately zero with respect to the frequency $f_{LO}$ of the local oscillation signal. That is, the connection point 24, X is practically in a roughly grounded condition for the frequency $f_{LO}$.

Therefore, the voltage of the local oscillation signal of the frequency $f_{LO}$ inputted from the local oscillation signal terminals 33, 51 to the local oscillation signal transmission line 28, 44 is wholly applied to the anti-parallel diode pair 25, 41. Then, the signal is mixed with the intermediate frequency signal of the frequency $f_{IF}$ inputted from the intermediate frequency signal terminal 31, 50 to the intermediate frequency signal transmission line 27, 43 in the anti-parallel diode pair 25, 41, and only the signal of the frequency component of $f_{RF}=2\times f_{LO}+f_{IF}$ is transmitted through the high-frequency bandpass filter 23, 47 and outputted from the high-frequency signal terminal 34, 52.

That is, the present embodiment eliminates the open stub, which is provided in the conventional even-harmonic mixer to provide equivalent grounding for the frequency $f_{LO}$ and of which the line length is about 1 mm. By thus simplifying the connection between the even-harmonic mixer and the high-frequency bandpass filter, the circuit layout of the filter-integrated even-harmonic mixer is made very compact as shown in FIGS. 2A and 2B. Therefore, the chip size can be shrunk.

Moreover, as in the present embodiment, the even-harmonic mixer 21, the high-frequency bandpass filter 23, 47 and the transmission line 22, 46 are integrated on one gallium arsenide substrate 53. Therefore, even in the case of a very high frequency in the milliwave band or the like, the signal loss at the connection portion between the high-frequency bandpass filter 23, 47 and the even-harmonic mixer 21 can be reduced as far as possible.

(Second Embodiment)

Figure 7:
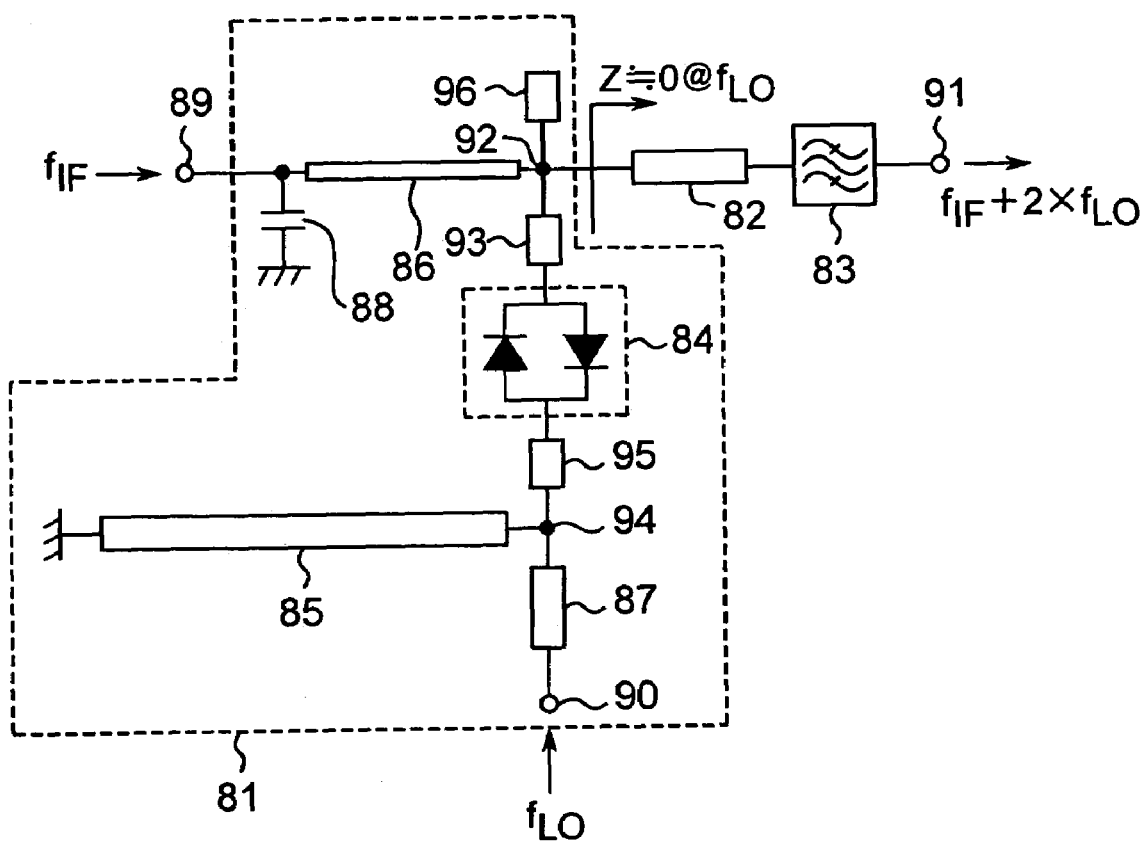
FIG. 7 is a diagram showing the construction of a filter-integrated even-harmonic mixer different from that of FIG. 1.

FIG. 7 is a diagram showing the construction of the filter-integrated even-harmonic mixer of the second embodiment. The present filter-integrated even-harmonic mixer is essentially the same as the filter-integrated even-harmonic mixer described in connection with the first embodiment. That is, an even-harmonic mixer 81, a transmission line 82, a high-frequency bandpass filter 83, an anti-parallel diode pair 84, a short stub 85, an intermediate frequency signal transmission line 86, a local oscillation signal transmission line 87, a capacitor 88, an intermediate frequency signal terminal 89, a local oscillation signal terminal 90 and a high-frequency signal terminal 91 are the same as the even-harmonic mixer 21, the transmission line 22, the high-frequency bandpass filter 23, the anti-parallel diode pair 25, the short stub 26, the intermediate frequency signal transmission line 27, the local oscillation signal transmission line 28, the capacitor 29, the intermediate frequency signal terminal 31, the local oscillation signal terminal 33 and the high-frequency signal terminal 34, respectively, shown in FIG. 1 of the first embodiment.

The present embodiment differs from the first embodiment in that, in order to achieve matching between the even-harmonic mixer 81 and the transmission line 82 with respect to the signal of the frequency $f_{RF}$ at a connection point 92 between the even-harmonic mixer 81 and the transmission line 82, a transmission line 93 is added between one end of the anti-parallel diode pair 84 and the connection point 92, a transmission line 95 is added between the other end of the anti-parallel diode pair 84 and a connection point 94 between the short stub 85 and the local oscillation signal transmission line 87, and that an open stub 96 is additionally connected to the connection point 92. It is to be noted that the transmission lines 93 and 95 and the open stub 96 can be of a length as short as 0.05λ to 0.10λ for the frequency $f_{RF}$. Therefore, the expansion of the circuit layout of the filter-integrated even-harmonic mixer and the expansion of the chip size can be suppressed to a minimum.

(Third Embodiment)

Figure 8:
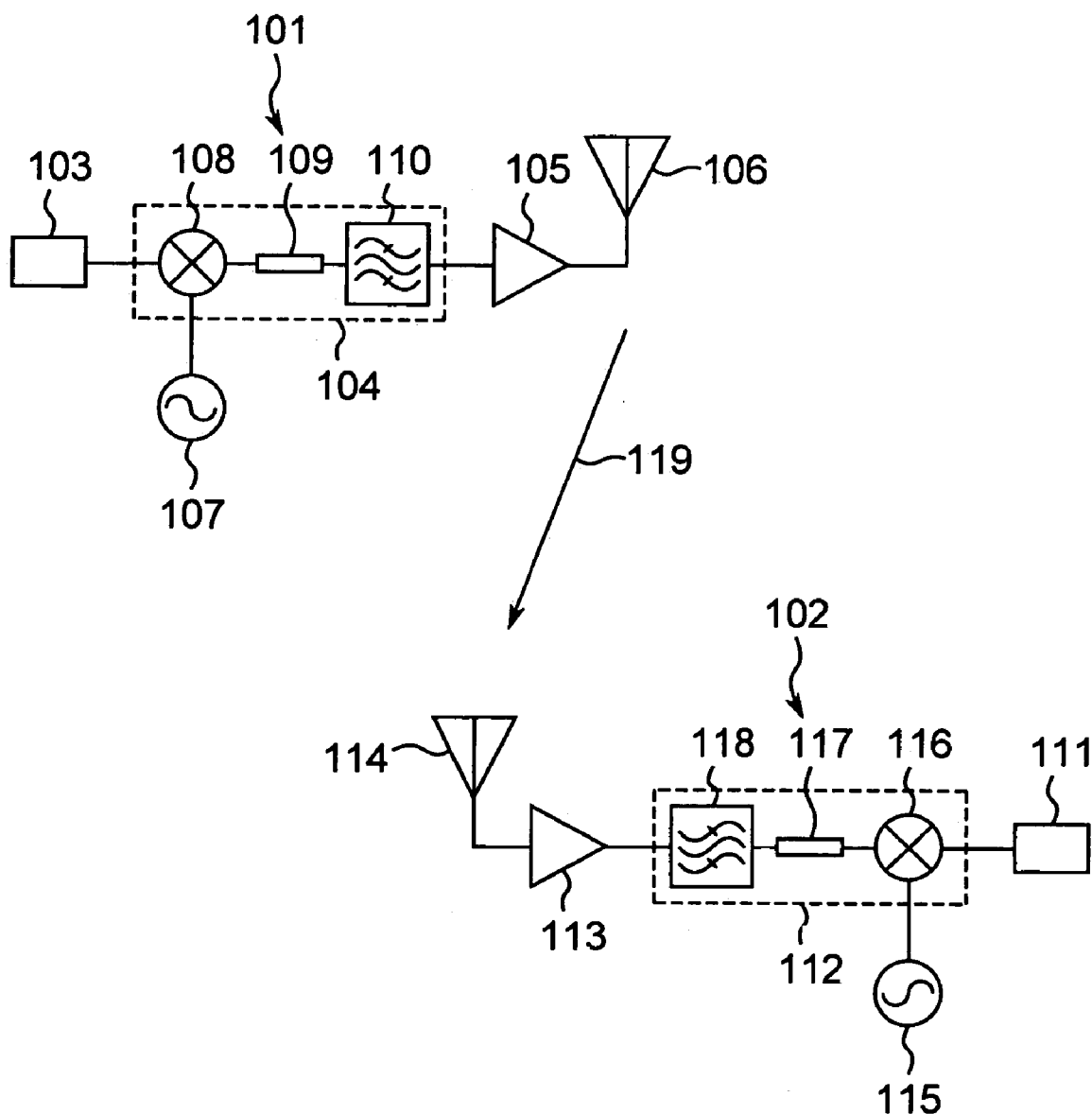
FIG. 8 is a block diagram of a high-frequency radio communication device of this invention.
Figure 9:
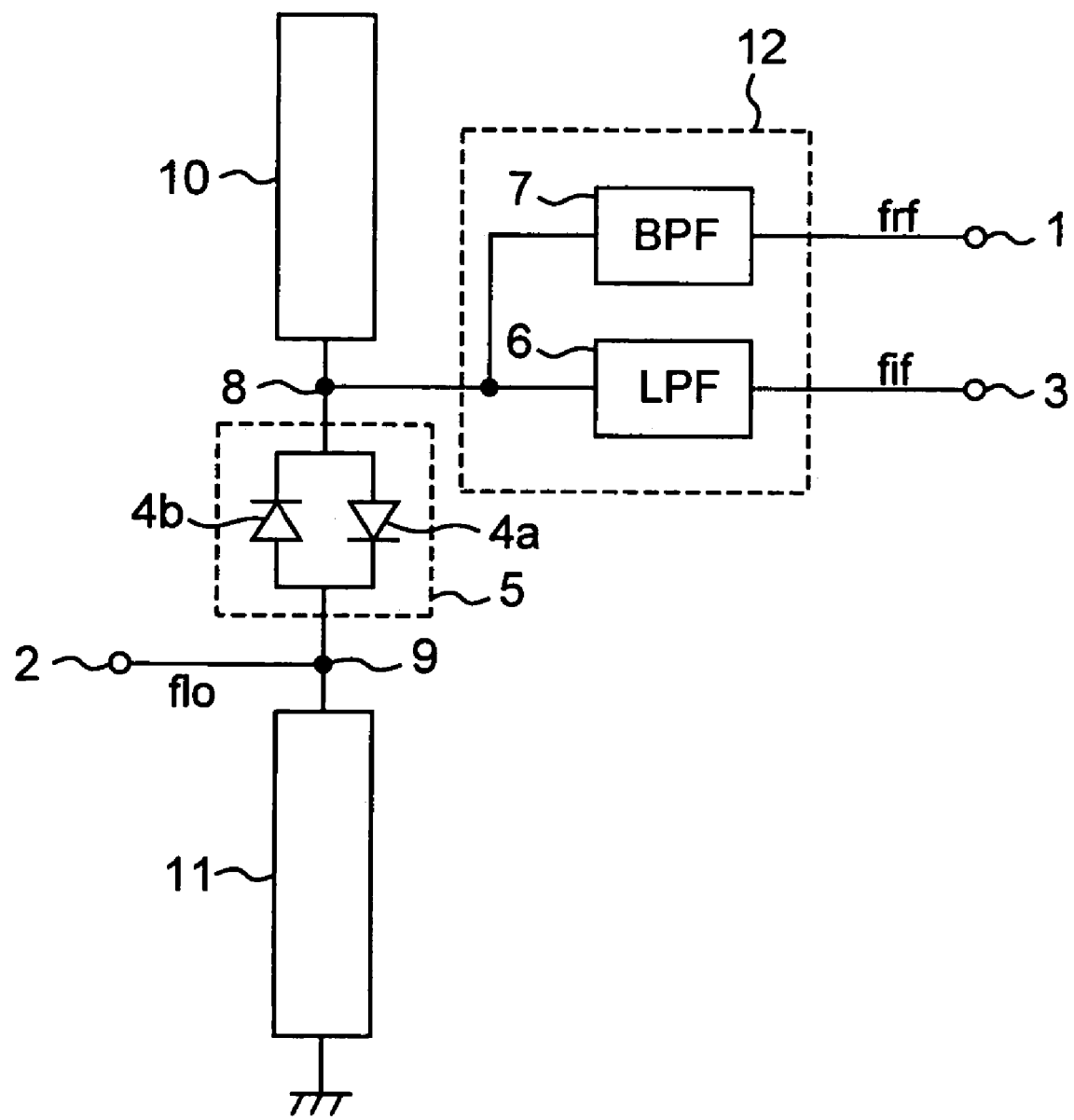
FIG. 9 is a block diagram of a conventional even-harmonic mixer.

The present embodiment relates to a high-frequency radio communication device that employs the filter-integrated even-harmonic mixer of the first or second embodiment for a transmitter and a receiver. FIG. 8 is a block diagram of the present high-frequency radio communication device. In FIG. 8, a transmitter 101 is constructed of a modulation signal source 103, a filter-integrated even-harmonic mixer 104, a power amplifier 105, an antenna 106 and a local oscillation signal source 107. The filter-integrated even-harmonic mixer 104 is constructed of an even-harmonic mixer 108 as an upconverter, a transmission line 109 and a high-frequency bandpass filter 110. Moreover, a receiver 102 is constructed of a tuner 111, a filter-integrated even-harmonic mixer 112, a low-noise amplifier 113, an antenna 114 and a local oscillation signal source 115. The filter-integrated even-harmonic mixer 112 is constructed of an even-harmonic mixer 116 as a down converter, a transmission line 117 and a high-frequency bandpass filter 118. In this case, the modulation signal source 103 outputs images and data and is represented by, for example, the intermediate frequency signal of a broadcasting satellite or a communications satellite.

The high-frequency radio communication device having the aforementioned construction operates as follows. That is, an intermediate frequency signal generated in the modulation signal source 103 of the transmitter 101 falls within a frequency range of 1 GHz to 3 GHz and is supplied to the intermediate frequency signal terminal (corresponding to 31, 50, or 89) of the filter-integrated even-harmonic mixer 104. On the other hand, a local oscillation signal generated in the local oscillation signal source 107 has a sine wave at a frequency of 29.5 GHz and is inputted to the local oscillation signal terminal (corresponding to 33, 51, or 90) of the filter-integrated even-harmonic mixer 104. Then, the intermediate frequency signal and the local oscillation signal are mixed with each other in the filter-integrated even-harmonic mixer 104. Thus, among the signals generated in the filter-integrated even-harmonic mixer 104, only high-frequency signals within the frequency range of 60 GHz to 63 GHz are outputted, and then amplified by the power amplifier 105, and finally radiated as a high-frequency radio wave 119 from the antenna 106.

The radiated high-frequency radio wave 119 is received by the antenna 114 of the receiver 102 to become a high-frequency signal in the receiver 102 and amplified by the low-noise amplifier 113. The resulting signal is then inputted to the high-frequency signal terminal (corresponding to 34, 52, or 91) of the filter-integrated even-harmonic mixer 112. On the other hand, a sine wave signal having a frequency of 29.5 GHz generated in the local oscillation signal source 115 is inputted to the local oscillation signal terminal of the filter-integrated even-harmonic mixer 112. Then, the high-frequency signal is mixed with the local oscillation signal in the filter-integrated even-harmonic mixer 112 to thereby be reconverted to the intermediate frequency signal within the frequency range of 1 GHz to 3 GHz. The thus obtained intermediate frequency signal is supplied to the tuner 111 in which the signal is converted into desired information.

As described above, the filter-integrated even-harmonic mixer 104 and the filter-integrated even-harmonic mixer 112 employ the even-harmonic mixer of the first or second embodiment. Utterly the same structure can be used for the filter-integrated even-harmonic mixer 104 and the filter-integrated even-harmonic mixer 112. Moreover, it is acceptable to employ an identical structure for the power amplifier 105 and the low-noise amplifier 113, an identical structure for the antenna 106 and the antenna 114, and an identical structure for the local oscillation signal source 107 and the local oscillation signal source 115.

The filter-integrated even-harmonic mixer 104, the power amplifier 105 and the local oscillation signal source 107 of the transmitter 101 may be totally or partially integrated into one semiconductor chip. Particularly, when the filter-integrated even-harmonic mixer 104 and the power amplifier 105 are integrated with each other, losses at the connection portions thereof can be remarkably reduced, and the gain of the power amplifier necessary for outputting a prescribed transmission power is reduced. As a result, it becomes possible to reduce the size and the power consumption of the transmitter. Likewise, the filter-integrated even-harmonic mixer 112, the low-noise amplifier 113 and the local oscillation signal source 115 of the receiver 102 may be totally or partially integrated into one semiconductor chip.

What is claimed is:

1. A filter-integrated even-harmonic mixer comprising:
   an even-harmonic mixer; and
   a high-frequency bandpass filter connected to the even-harmonic mixer via a transmission line,
   wherein the transmission line has a length set so that impedance of the filter-integrated even-harmonic mixer on the transmission line side viewed from a connection point between the even-harmonic mixer and the transmission line is roughly zero for a frequency of a local oscillation signal inputted to the even-harmonic mixer.

2. The filter-integrated even-harmonic mixer as claimed in claim 1, wherein
   a circuit in which the transmission line and the high-frequency bandpass filter are integrated with each other has a transmission loss of 20 dB or more, a reflection loss of approximately 0 dB and a reflection phase angle of approximately −180° at the frequency of the local oscillation signal.

3. The filter-integrated even-harmonic mixer as claimed in claim 1, wherein
   the even-harmonic mixer includes at least an anti-parallel diode pair and a short stub.

4. The filter-integrated even-harmonic mixer as claimed in claim 3, wherein the even-harmonic-mixer and the high frequency bandpass filter are formed on a semiconductor substrate.

5. The filter-integrated even-harmonic mixer as claimed in claim 3, wherein
   the anti-parallel diode pair has one end constituting the connection point and the other end connected to the short stub.

6. The filter-integrated even-harmonic mixer as claimed in claim 5, wherein
   a local oscillation signal is inputted to a connection point between the anti-parallel diode pair and the short stub.

7. The filter-integrated even-harmonic mixer as claimed in claim 6, wherein the even-harmonic mixer and the high-frequency bandpass filter are integrated on one semiconductor chip.

8. The filter-integrated even-harmonic mixer as claimed in claim 1, wherein
   the high-frequency bandpass filter has a microstrip resonator.

9. The filter-integrated even-harmonic mixer as claimed in claim 1, wherein
   the high-frequency bandpass filter has an input circuit and an output circuit, which are each constructed of a microstrip line, and
   the input circuit and the output circuit are coupled to each other by at least one of capacitive coupling and magnetic coupling.

10. A high-frequency radio communication device having a transmitter and receiver therein, wherein at least one of the transmitter or receiver includes a filter-integrated even-harmonic mixer comprising:
    an even harmonic mixer; and
    a high-frequency bandpass filter connected to the even harmonic mixer via a transmission line,
    wherein said transmission line has a length set so that impedance of the filter-integrated even-harmonic mixer on the transmission line side viewed from a connection point between the even harmonic mixer and the transmission line is roughly zero for a frequency of a local oscillation signal inputted to the even-harmonic mixer.

11. The high frequency radio communication device as claimed in claim 10, wherein a circuit in which the transmission line and the high-frequency bandpass filter are integrated with each other has a transmission loss of 20 dB or more, a reflection loss of approximately 0 dB and a reflection phase angle of approximately −180° at the frequency of the local oscillation signal.

12. The high frequency radio communication device as claimed in claim 10, wherein the even-harmonic mixer includes at least an anti-parallel diode pair and a short stub.

13. The high frequency radio communication device as claimed in claim 12, wherein the even-harmonic-mixer and the high frequency bandpass filter are formed on a semiconductor substrate.

14. The high frequency radio communication device as claimed in claim 12, wherein the anti-parallel diode pair has one end constituting the connection point and the other end connected to the short stub.

15. The high frequency radio communication device as claimed in claim 14, wherein a local oscillation signal is inputted to a connection point between the anti-parallel diode pair and the short stub.

16. The high frequency radio communication device as claimed in claim 15, wherein the even-harmonic mixer and the high-frequency bandpass filter are integrated on one semiconductor chip.

17. The high frequency radio communication device as claimed in claim 10, wherein the high-frequency bandpass filter has a microstrip resonator.

18. The high frequency radio communication device as claimed in claim 10, wherein the high-frequency bandpass filter has an input circuit and an output circuit, which are each constructed of a microstrip line, and the input circuit and the output circuit are coupled to each other by at least one of capacitive coupling and magnetic coupling.

* * * * *